(12) United States Patent
McGivney et al.

(10) Patent No.: US 11,385,311 B2
(45) Date of Patent: Jul. 12, 2022

(54) SYSTEM AND METHOD FOR IMPROVED MAGNETIC RESONANCE FINGERPRINTING USING INNER PRODUCT SPACE

(71) Applicant: Case Western Reserve University, Cleveland, OH (US)

(72) Inventors: Debra McGivney, Bay Village, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 289 days.

(21) Appl. No.: 16/858,848

(22) Filed: Apr. 27, 2020

(65) Prior Publication Data

US 2020/0341089 A1    Oct. 29, 2020

Related U.S. Application Data

(60) Provisional application No. 62/838,867, filed on Apr. 25, 2019.

(51) Int. Cl.
*G01R 33/48* (2006.01)
*G01R 33/56* (2006.01)
*G01R 33/561* (2006.01)

(52) U.S. Cl.
CPC ..... *G01R 33/4828* (2013.01); *G01R 33/5608* (2013.01); *G01R 33/5614* (2013.01)

(58) Field of Classification Search
USPC .......................................................... 702/19
See application file for complete search history.

(56) References Cited

U.S. PATENT DOCUMENTS

| | | |
|---|---|---|
| 8,723,518 B2 | 5/2014 | Seiberlich |
| 2015/0301141 A1 | 10/2015 | Griswold |
| 2015/0302579 A1* | 10/2015 | Griswold ........... G01R 33/5608 382/128 |
| 2018/0292492 A1* | 10/2018 | Griswold ............... G01R 33/50 |
| 2019/0353736 A1* | 11/2019 | Gulani ............. G01R 33/56366 |
| 2021/0312626 A1* | 10/2021 | Griswold ........... G01R 33/5608 |

OTHER PUBLICATIONS

Cauley, Stephen F., et al. "Fast group matching for MR fingerprinting reconstruction." Magnetic resonance in medicine 74.2 (2015): 523-528.
Jiang, Y., et al. "MR fingerprinting using fast imaging with steady state precession (FISP) with spiral readout." Magnetic resonance in medicine 74.6 (2015): 1621-1631.
Ma, D. et al., in "Magnetic Resonance Fingerprinting," Nature, 2013; 495(7440):187-192.
McGivney, Debra F., et al. "SVD compression for magnetic resonance fingerprinting in the time domain." IEEE transactions on medical imaging 33.12 (2014): 2311-2322.
Wang, C. et al. Magnetic resonance fingerprinting with pure quadratic rf phase. Poster 4552. ISMRM 2019.
Wang, C. Y., et al. "Magnetic resonance fingerprinting with quadratic RF phase for measurement of T2* simultaneously with df, T1, and T2." Magnetic resonance in medicine 81.3 (2019): 1849-1862. First published Oct. 30, 2018.

* cited by examiner

*Primary Examiner* — Rodneye E Fuller
(74) *Attorney, Agent, or Firm* — Quarles & Brady LLP (57) ABSTRACT

A system and method is provided for improved magnetic resonance fingerprinting (MRF) data dictionary matching using an MRF dictionary having entries with an inner product storing tissue properties.

10 Claims, 7 Drawing Sheets
(4 of 7 Drawing Sheet(s) Filed in Color)

SYSTEM AND METHOD FOR IMPROVED MAGNETIC RESONANCE FINGERPRINTING USING INNER PRODUCT SPACE

CROSS-REFERENCE TO RELATED APPLICATIONS

This application is based on, claims priority to, and incorporates herein by reference in its entirety, U.S. Provisional Application Ser. No. 62/838,867, filed Apr. 25, 2019, and entitled, "SYSTEM AND METHOD FOR IMPROVED MAGNETIC RESONANCE FINGERPRINTING USING INNER PRODUCT SPACE."

STATEMENT REGARDING FEDERALLY SPONSORED RESEARCH

This invention was made with government support under EB016728 and EB017219 awarded by National Institutes of Health. The government has certain rights in the invention.

BACKGROUND

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Magnetic resonance fingerprinting ("MRF") is a technology, which is described, as one example, by D. Ma, et al., in "Magnetic Resonance Fingerprinting," Nature, 2013; 495 (7440):187-192, that allows one to characterize tissue species using nuclear magnetic resonance ("NMR"). MRF can identify different properties of a resonant species (e.g., T1 spin-lattice relaxation, T2 spin-spin relaxation, proton density) to thereby correlate this information to quantitatively assess tissue properties. Other properties like tissue types and super-position of attributes can also be identified using MRF. These properties and others may be identified simultaneously using MRF.

In particular, unlike conventional MRI, MRF employs a series of varied sequence blocks (e.g., variable acquisition parameters) to gather tissue information based on unique signal evolutions generated in different resonant species (e.g., tissues) to which a radio frequency ("RF") is applied. The signals from different resonant tissues will, however, be different and can be distinguished using MRF techniques. The different signals can be collected over a period of time to identify a signal evolution within a voxel. Resonant species in the voxel can then be characterized by comparing the signal evolution to known evolutions, for example, by comparing acquired signal evolutions to known evolutions using a pattern matching algorithm. Characterizing the resonant species may include identifying a material and tissue type. Alternatively, characterizing the resonant species may include identifying MR parameters associated with the resonant species. The "known" evolutions may be, for example, simulated evolutions calculated from physical principles and/or previously acquired evolutions. A large set of known evolutions may be stored in a MRF dictionary.

SUMMARY OF THE DISCLOSURE

The present disclosure provides a system and method for reducing the size of a magnetic resonance fingerprinting dictionary and correspondingly reducing computational and management resources by providing a framework to approximate an inner product as a quadratic function of MRF products. For example, the inner product may be a quadratic function of tissue properties.

In one aspect, the present disclosure provides a method for generating a map of a tissue property in a subject using magnetic resonance fingerprinting (MRF) data. The method includes accessing MRF data formed by acquiring a series of signal evolutions from tissue of a subject in a region of interest while performing an MRF process. The method also includes accessing an MRF dictionary having entries given as a function of a tissue property vector given by $q, d=d(q)$, wherein a given voxel is represented by $q_0$, an acquired MRF signal evolution from the given voxel is given by $s=d(q_0)+e$, where s is the MRF signal evolution and e is a noise term. The method further includes comparing the MRF data to the MRF dictionary to identify a tissue property of the region of interest by comparing inner product values between s and each entry in the MRF dictionary. The method also includes generating the map of the tissue property based on the tissue in the region of interest of the subject.

In another aspect, the present disclosure provides a magnetic resonance fingerprinting (MRF) system including a magnet system configured to generate a polarizing magnetic field about at least a portion of a subject and a magnetic gradient system including a plurality of magnetic gradient coils configured to apply at least one magnetic gradient field to the polarizing magnetic field. The MRF system also includes a radio frequency (RF) system configured to apply an RF field to the subject and to receive magnetic resonance signals from the subject using a coil array and a computer system. The computer system is programmed to control the magnetic gradient system and the RF system to perform an MRF process and MRF data formed by acquiring a series of signal evolutions from tissue of a subject in a region of interest while performing the MRF process. The computer system is also configured to access an MRF dictionary having entries given as a function of a tissue property vector given by $q, d=d(q)$, wherein a given voxel is represented by $q_0$, an acquired MRF signal evolution from the given voxel is given by $s=d(q_0)+e$, where s is the MRF signal evolution and e is a noise term. The computer system is further programmed to compare the MRF data to the MRF dictionary to identify a tissue property of the region of interest by comparing inner product values between s and each entry in the MRF dictionary. Also, the computer system is programmed to generate the map of the tissue property based on the tissue in the region of interest of the subject.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Magnetic resonance fingerprinting ("MRF") is a technique that facilitates mapping of tissue or other material properties based on random, pseudorandom, or otherwise varied measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The random, pseudorandom, patterned, or otherwise varied measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. In some instances, the acquisition parameters can be varied according to a non-random or a non-pseudorandom pattern that otherwise results in signals from different materials or tissues to be spatially incoherent, temporally incoherent, or both.

From these measurements, MRF processes can be designed to map a wide variety of parameters that may be mapped individually or simultaneously. Examples of such parameters include, but are not limited to, longitudinal relaxation time ($T_1$), transverse relaxation time ($T_2$), main or static magnetic field map ($B_0$), and proton density (PD). Unlike conventional MR systems, tissue property maps may be generated simultaneously using MRF. Thus, rather than subjecting a patient to multiple serial acquisitions that may take a half hour or more, the patient may experience a much shorter time in the bore. Similarly, rather than making a radiologist wait for multiple images that are produced serially (e.g., a first pulse sequence to generate a $T_1$ map, a second pulse sequence to generate a $T_2$ map), the radiologist may be provided with maps that are produced simultaneously from the MRF data.

Examples of such parameters include, but are not limited to, longitudinal relaxation time ($T_1$), transverse relaxation time ($T_2$), main or static magnetic field map ($B_0$), and proton density (PD). MRF is generally described in U.S. Pat. No. 8,723,518 and Published U.S. Patent Application No. 2015/0301141, each of which is incorporated herein by reference in its entirety.

The signal evolutions that are acquired with MRF techniques are compared with a dictionary of signal models, or templates, that have been generated for different acquisition parameters from magnetic resonance signal models, such as Bloch equation-based physics simulations. The dictionary may also comprise a series of previously acquired known evolutions. This comparison allows estimation of the physical parameters, such as those mentioned above. As an example, the comparison of the acquired signals to a dictionary are typically performed using any a matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1, T_2, D, \dots)$ or may include fewer terms, such as by not including the diffusion relaxation, as $E_i(T_1,T_2)$ or $E_i(T_1, T_2, \dots)$. Also, the summation on "j" could be replace by a product on "j".

Conventional MRF dictionaries typically comprise massive data sets, especially when fine MRF dictionaries or MRF dictionaries with multiple components are taken into account (e.g., chemical exchange effects). These massive data sets can easily approach billions of elements, which pose a problem by placing significant constraints on conventional MRF methods that load, process, or store a MRF dictionary.

MRF can use an inner-product matching process with the dictionary to create the quantitative tissue property maps. As such, the overall range and step size of each tissue property is a determining factor in the accuracy and precision of the maps. As a result, the dictionary can grow prohibitively large when seeking to provide a matching across a varied range of tissue and material properties and/or to provide great precision in quantification. Furthermore, as the size of the dictionary grows, so does the matching process. Thus, the process of generating the quantitative MRF maps can be highly resource intensive, including storage and/or memory resources and/or computational time. Therefore, there is a need in the art to improve the efficiency of producing MRF maps.

The present disclosure provides systems and methods that utilize a framework to approximate the inner product as a quadratic function of the tissue properties themselves, allowing the dictionary size to be reduced and, correspondingly, computational and management resources to be reduced.

Figure 1:
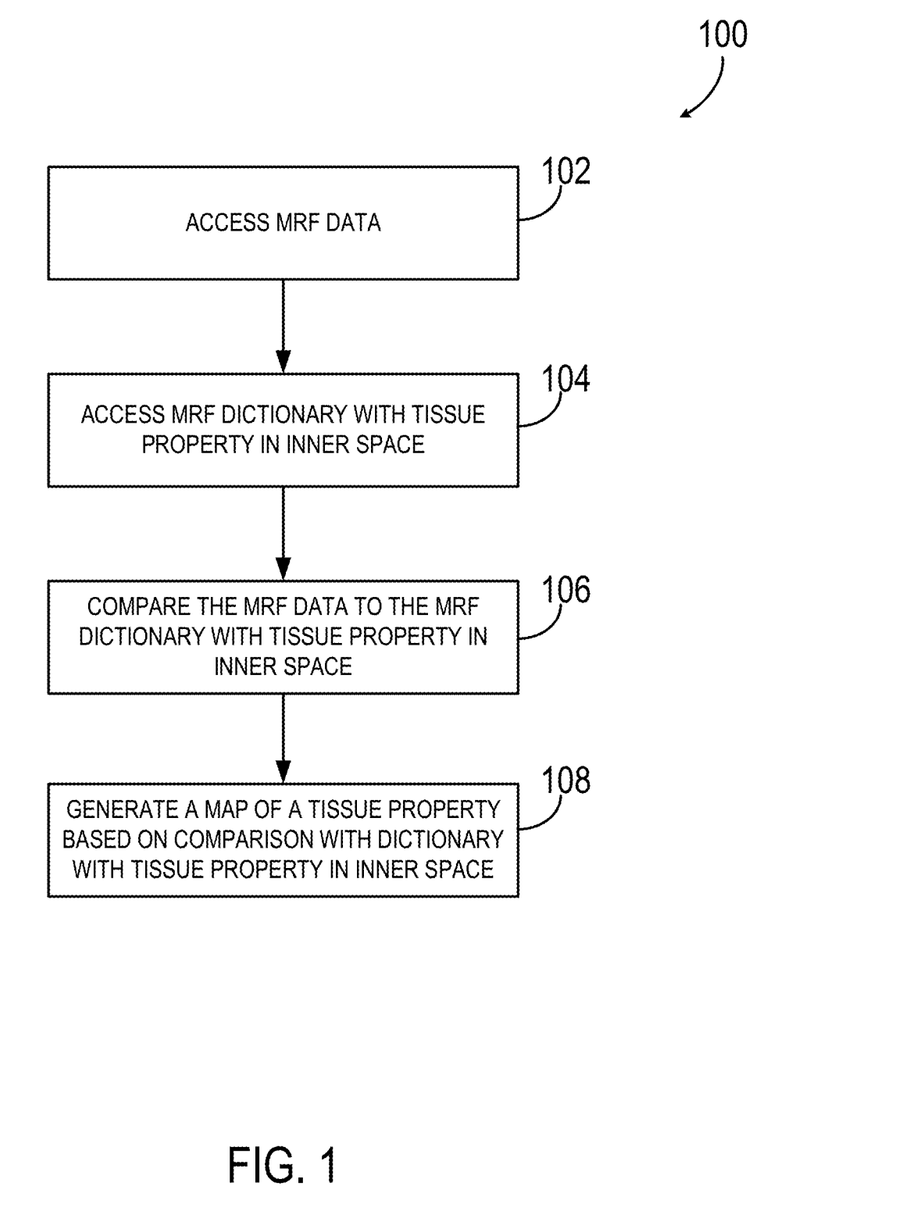
FIG. 1 is a schematic flow chart illustrating one non-limiting example of a process for MRF dictionary matching in accordance with the present disclosure.

Referring to FIG. 1, a process 100 for using the framework provided herein can take any of a variety of forms, but one non-limiting example is provided for performing a dictionary matching using a non-linear fitting in inner product space, such as a quadratic fitting. The process 100, may include accessing MRF data at process block 102, which may be stored MRF data or may be data that is acquired while controlling an NMR or MRI system to perform an MRF process, such as will be described. At process block 104, an MRF dictionary using a non-linear (e.g., quadratic) fitting in inner product space may be accessed. An inner product space is a vector space with an additional structure, called an inner product, that associates each pair of vectors in the space with a scalar quantity, known as the inner product of the vectors. Thus, as will be described in detail below, the present disclosure utilizes the inner product as a function of the tissue properties reflected in the MRF dictionary, allowing the dictionary size to be reduced and, correspondingly, computational and management resources to be reduced. Thus, at process block 106, a new and more efficient MRF dictionary matching process may be performed to generate or display an MRF map of tissue properties, such as described herein.

The MRF dictionary can be conceptualized as a large matrix of size m×n, where m is the number of time points in the pulse sequence, and n is the number of tissue property combinations. For a given pulse sequence, the dictionary entries can be represented as a function of the tissue property vector given by q, d=d(q). That is, assuming that a given voxel is represented by tissue $q_0$, the acquired MRF signal evolution from this voxel can be written as $s=d(q_0)+e$, where s is the MRF signal evolution and e is a noise term. Utilizing the systems and methods of the present disclosure, the signal evolution, s, can be matched to the dictionary by comparing the inner product values between s and each dictionary entry to find, for example, the maximum in absolute value. The inner product can be written as:

$$f(q)=s^*d(q)=(d(q_0)+e)^*d(q)=d(q_0)^*d(q)+e^*d(q) \quad (2);$$

where * denotes a conjugate transpose. Note that in the case where q is in a neighborhood of $q_0$, then a quadratic approximation of the inner product (i.e., $f(q) \approx \|d(q)\|^2$) is appropriate. After applying a Taylor series expansion of d in a neighborhood of $q_0$, the inner product can be written as a quadratic function of $q=(T_1,T_2)$, where T1 and T2 are the longitudinal and transverse relaxation times, respectively.

This framework is not limited to a particular pulse sequence. As a non-limiting example, for MRF fast imaging with steady-state free precession (FISP), the inner product can be approximated as the quadratic:

$$f(T_1,T_2) \approx p_{00}+p_{10}T_1+p_{01}T_2+p_{11}T_1T_2+p_{20}T_1^2+p_{02}T_2^2 \quad (3);$$

for some coefficients p_ij. A tissue property neighborhood can be estimated that contains the true values by matchings to a MRF dictionary with larger tissue property step sizes (i.e., a "coarse dictionary").

As a non-limiting example, using the corresponding inner product values associated with this neighborhood, the above coefficients in equation (3) can be calculated for MRF-FISP, and its critical point can be located. This model can be generalized to more than two tissue properties, as in the case of MRF-balanced steady-state free precession (bSSFP) or MRF with quadratic phase.

In one non-limiting example, the quadratic inner product model was tested on a simulated brain phantom using a FISP pulse sequence to perform an MRF study. A dictionary of size 3000×5970 was used to create simulated MRF signal evolutions, which were taken as the true values. The coarse dictionary had dimensions 3000×1510, formed by downsampling the larger dictionary tissue properties each by 2. At each pixel, a neighborhood of points was found by matching the signal evolution to the coarse dictionary, and then equation (3) was approximated and the critical point found.

Three volunteers provided consent and were scanned under an IRB-approved study. They were a normal subject scanned with MRF-FISP, a brain tumor patient (adenocarcinoma metastasis) scanned with MRF-bSSFP, and a normal volunteer scanned with qRF-MRF. A one-shot spiral trajectory was used in each case and SVD compression was used for both the benchmark and coarse dictionaries for compression.

Figure 2:
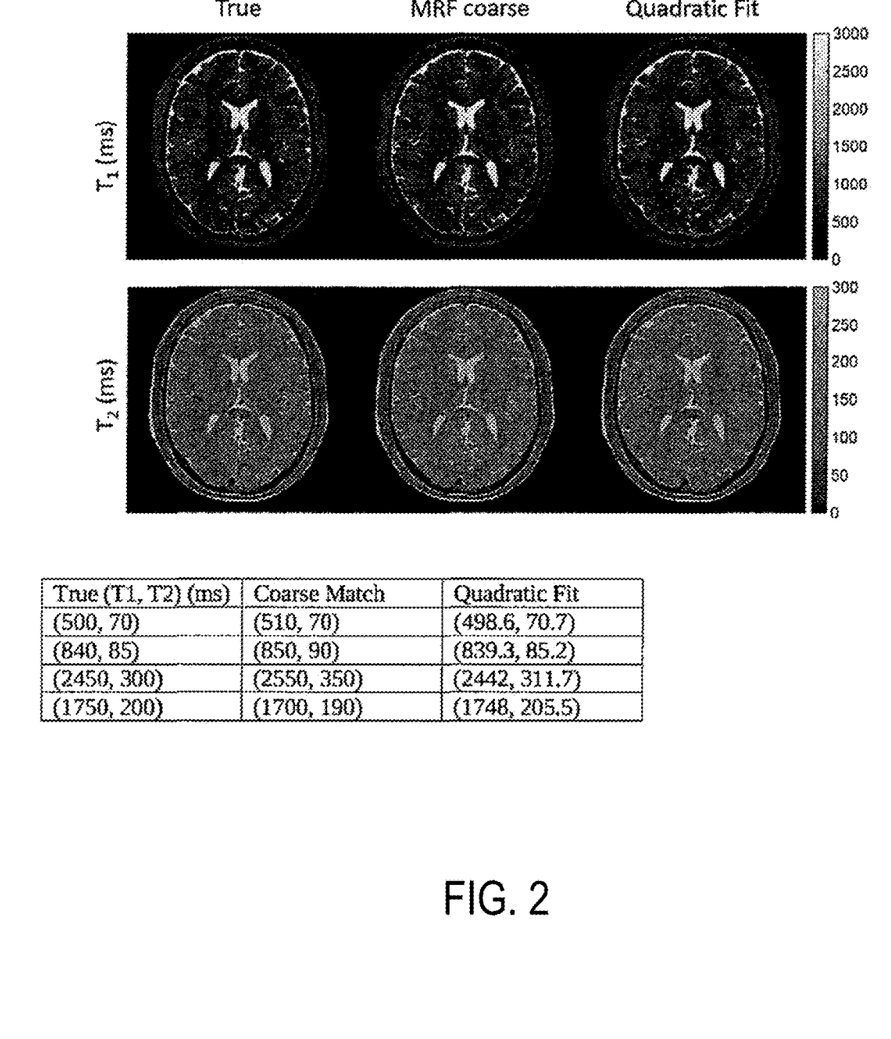
FIG. 2 is a set of correlated images providing T1, T2 maps for a numerical brain phantom study. In the left column are the true values, in the middle are maps found matching to a coarse MRF dictionary, and on the right are the values found by applying quadratic interpolation on the coarse MRF results. In the table, four pixels were chosen to compare the results from the coarse match and quadratic fit to the true values.

Results from the numerical brain-phantom study are illustrated FIG. 2, with four pixels highlighted. In all cases where the true tissue properties were not present in the coarse dictionary, an improved result was found through quadratic fitting.

Figure 3:
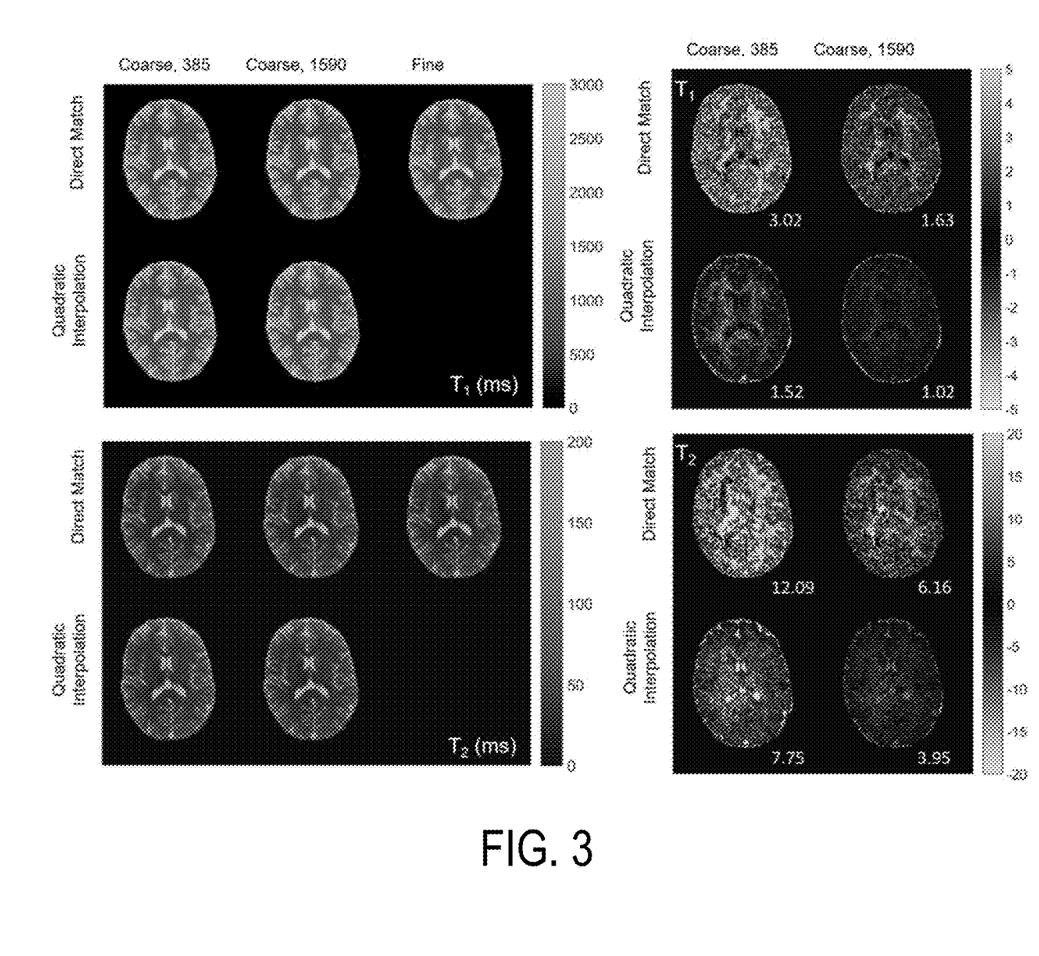
FIG. 3 is a set of images providing T1 and T2 maps acquired from a normal volunteer scanned with MRF-FISP pulse sequence, and matched difference maps on the right.

For the normal volunteer, the dictionary with 5970 T1, T2 combinations was used as a benchmark, and a coarse dictionary with 1510 T1, T2 combinations, and a further coarse dictionary with 385 T1, T2 combinations was used for quadratic fitting. Tissue property maps computed using the quadratic fit and differences compared to the benchmark are illustrated in FIG. 3. Note that in most regions of the brain, the discrepancy between the quadratic interpolation and fine match is smaller than the discrepancy between the coarse and fine matches, indicating that the quadratic interpolation outperforms the traditional MRF matching with a coarse dictionary.

Figure 4:
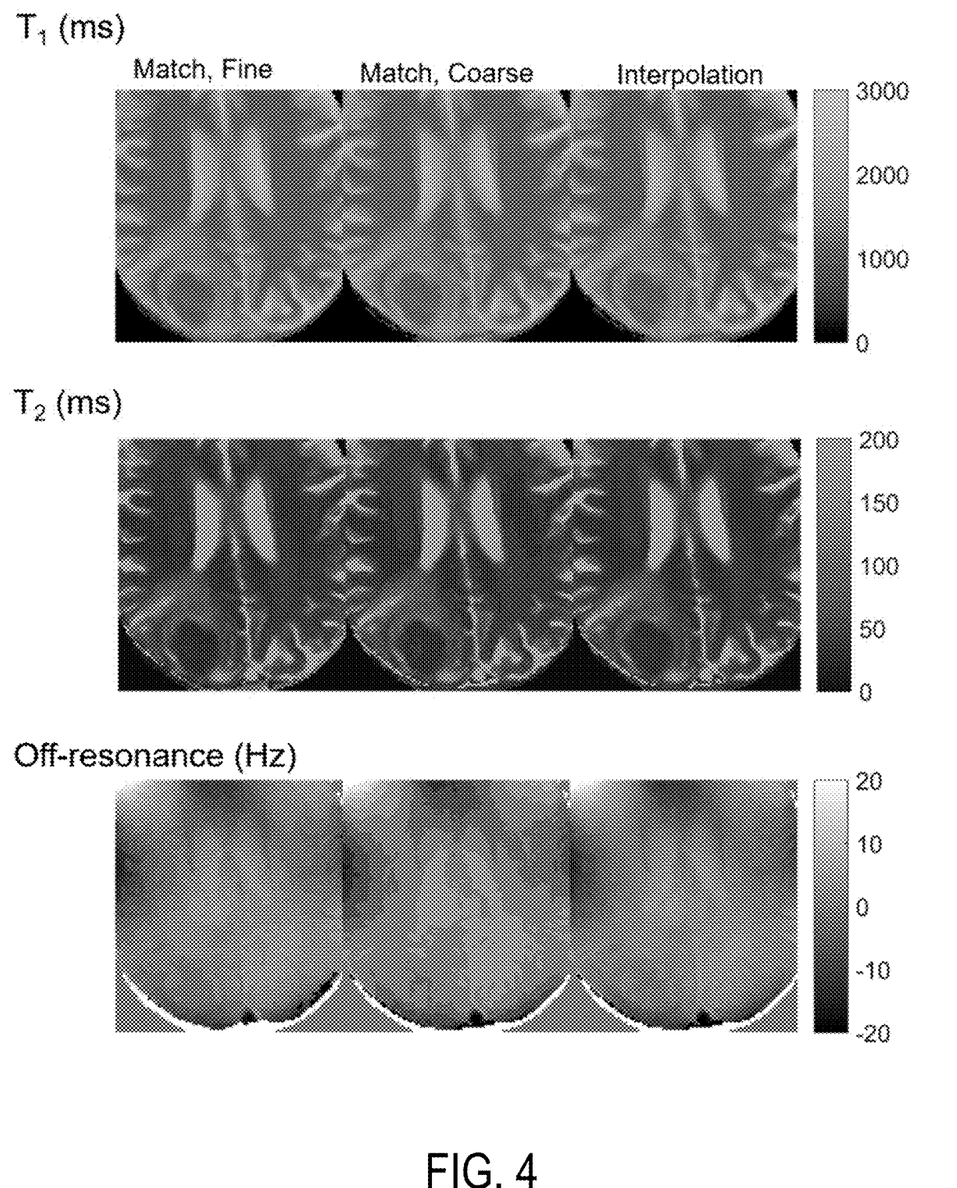
FIG. 4 is a set of images providing T1, T2, and off-resonance maps from a MRF-bSSFP acquisition of a brain of a patient with a tumor. The results from a fine MRF dictionary are in the left column, using a coarse MRF dictionary are in the middle, and the results from quadratic interpolation of the coarse dictionary are on the right.
Figure 5:
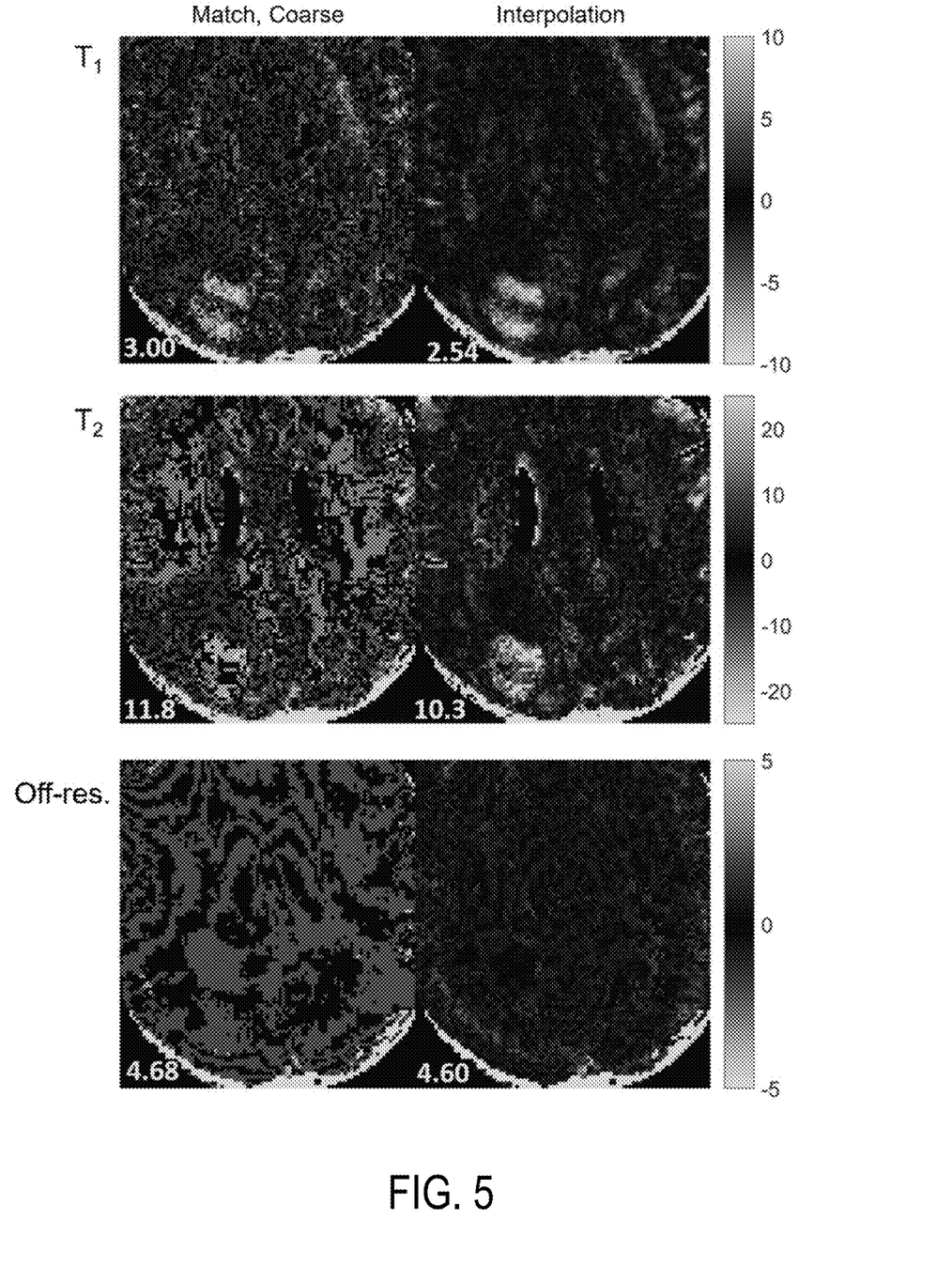
FIG. 5 is a set of images showing difference maps corresponding to the T1, T2, and off-resonance maps of FIG. 4. The T1 and T2 rows show the percent differences for T1 and T2, respectively, as compared to the maps obtained using direct matching with the fine dictionary. In the "Off-re" row a difference map is shown, as off-resonance frequency can be zero.

Since MRF-bSSFP is also sensitive to off-resonance, a modified version of equation (2) using three variables was used in one study. The MRF-bSSFP benchmark dictionary contained 3307 T1, T2 combinations and 77 off-resonance values and the coarse dictionary contained 854 T1, T2 combinations and 39 off-resonance values. Tissue property maps and differences are illustrated in FIGS. 4 and 5, respectively. In FIG. 4, the left-most image in each row illustrates images calculated using a fine MRF dictionary, the middle image used a coarse MRF dictionary, and the right image used a quadratic interpolation of the inner product space from the coarse dictionary. In FIG. 5, difference maps are shown, where the differences on the left column are between the coarse match compared to fine match, and on the right, the differences are between the quadratic interpolation compared to the fine dictionary match.

Figure 6:
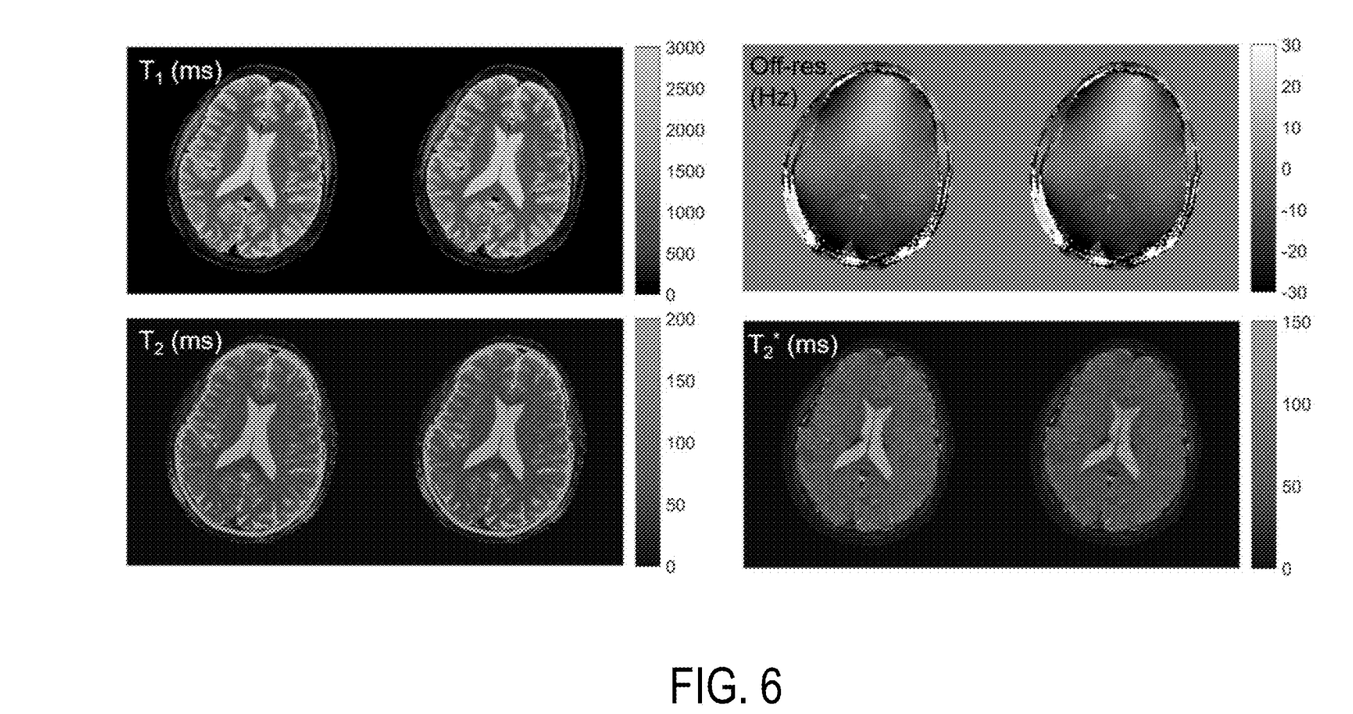
FIG. 6 is a set of images showing T1 and T2 maps from a patient scanned with 3D MRF FISP sequence. In each group of images, the left most column is computed using direct matching with the fine dictionary, the middle columns using direct matching with the coarse dictionary, and the right using quadratic interpolation from the coarse dictionary.

For qRF-MRF, only a coarse dictionary was used, which contained 1590 T1, T2 combinations, 51 off-resonance values, and 26 gamma values. Maps created form this qRF-MRF study are provided in FIG. 6. Specifically, FIG. 6 shows T1 and T2 maps from a patient scanned with 3D MRF FISP. In each group of images, the left-most column is computed using direct matching with the fine dictionary, the middle columns were computed using direct matching with the coarse dictionary, and the right-most column was computed using quadratic interpolation from the coarse dictionary.

This work demonstrates the feasibility of a quadratic approximation of inner product matching for MRF. Studies using three different sequence types were conducted, highlighting that the method is not specific to a particular sequence and provides advantages over traditional matching irrespective of the pulse sequence used for the MRF process. In most pixels, the quadratic fit provides a better approximation to the fine dictionary matching than the coarse dictionary, demonstrating the ability of the method to ameliorate the problem of step size in the MRF dictionary. Note that the quadratic fit is independent of how the initial matching results are obtained. Therefore, a method such as fast group matching for MRF can be used with the advantage of faster processing time.

Figure 7:
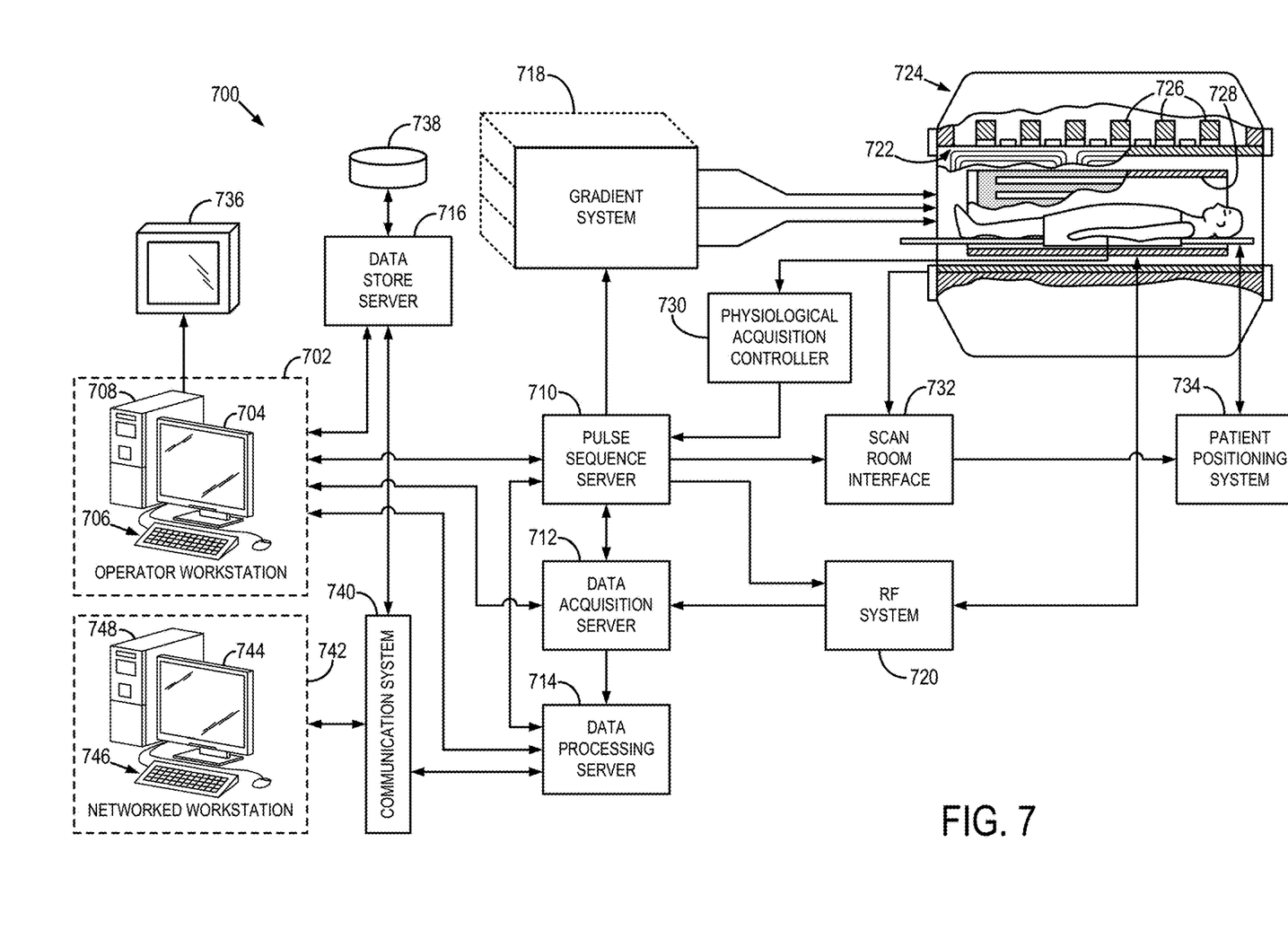
FIG. 7 is a block diagram of an example magnetic resonance fingerprinting ("MRF") system that can be used to implement the methods described in the present disclosure.

Referring now to FIG. 7, an example of an MRF system 700 that can implement the methods described here is illustrated. The MRF system 700 includes an operator workstation 702 that may include a display 704, one or more input devices 706 (e.g., a keyboard, a mouse), and a processor 708. The processor 708 may include a commercially available programmable machine running a commercially available operating system. The operator workstation 702 provides an operator interface that facilitates entering scan parameters into the MRF system 700. The operator workstation 702 may be coupled to different servers, including, for example, a pulse sequence server 710, a data acquisition server 712, a data processing server 714, and a data store server 716. The operator workstation 702 and the servers 710, 712, 714, and 716 may be connected via a communication system 740, which may include wired or wireless network connections.

The pulse sequence server 710 functions in response to instructions provided by the operator workstation 702 to operate a gradient system 718 and a radiofrequency ("RF") system 720. Gradient waveforms for performing a prescribed scan are produced and applied to the gradient system 718, which then excites gradient coils in an assembly 722 to produce the magnetic field gradients $G_x$, $G_y$, and $G_z$ that are used for spatially encoding magnetic resonance signals. The gradient coil assembly 722 forms part of a magnet assembly 724 that includes a polarizing magnet 726 and a whole-body RF coil 728.

RF waveforms are applied by the RF system 720 to the RF coil 728, or a separate local coil to perform the prescribed magnetic resonance pulse sequence. Responsive magnetic resonance signals detected by the RF coil 728, or a separate local coil, are received by the RF system 720. The responsive magnetic resonance signals may be amplified, demodulated, filtered, and digitized under direction of commands produced by the pulse sequence server 710. The RF system 720 includes an RF transmitter for producing a wide variety of RF pulses used in MRF pulse sequences. The RF transmitter is responsive to the prescribed scan and direction from the pulse sequence server 710 to produce RF pulses of the desired frequency, phase, and pulse amplitude waveform. The generated RF pulses may be applied to the whole-body RF coil 728 or to one or more local coils or coil arrays.

The RF system 720 also includes one or more RF receiver channels. An RF receiver channel includes an RF preamplifier that amplifies the magnetic resonance signal received by the coil 728 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (4);$$

and the phase of the received magnetic resonance signal may also be determined according to the following relationship:

$$\varphi = \tan^{-1}\left(\frac{Q}{I}\right). \qquad (5)$$

The pulse sequence server 710 may receive patient data from a physiological acquisition controller 730. By way of example, the physiological acquisition controller 730 may receive signals from a number of different sensors connected to the patient, including electrocardiograph ("ECG") signals from electrodes, or respiratory signals from a respiratory bellows or other respiratory monitoring devices. These signals may be used by the pulse sequence server 710 to synchronize, or "gate," the performance of the scan with the subject's heart beat or respiration.

The pulse sequence server 710 may also connect to a scan room interface circuit 732 that receives signals from various sensors associated with the condition of the patient and the magnet system. Through the scan room interface circuit 732, a patient positioning system 734 can receive commands to move the patient to desired positions during the scan.

The digitized magnetic resonance signal samples produced by the RF system 720 are received by the data acquisition server 712. The data acquisition server 712 operates in response to instructions downloaded from the operator workstation 702 to receive the real-time magnetic resonance data and provide buffer storage, so that data is not lost by data overrun. In some scans, the data acquisition server 712 passes the acquired magnetic resonance data to the data processor server 714. In scans that require information derived from acquired magnetic resonance data to control the further performance of the scan, the data acquisition server 712 may be programmed to produce such information and convey it to the pulse sequence server 710. For example, during pre-scans, magnetic resonance data may be acquired and used to calibrate the pulse sequence performed by the pulse sequence server 710. As another example, navigator signals may be acquired and used to adjust the operating parameters of the RF system 720 or the gradient system 718, or to control the view order in which k-space is sampled. In still another example, the data acquisition server 712 may also process magnetic resonance signals used to detect the arrival of a contrast agent in a magnetic resonance angiography ("MRA") scan. For example, the data acquisition server 712 may acquire magnetic resonance data and processes it in real-time to produce information that is used to control the scan.

The data processing server 714 receives magnetic resonance data from the data acquisition server 712 and processes the magnetic resonance data in accordance with instructions provided by the operator workstation 702. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 714 are conveyed back to the operator workstation 702 for storage. Real-time images may be stored in a data base memory cache, from which they may be output to operator display 702 or a display 736. Batch mode images or selected real time images may be stored in a host database on disc storage 738. When such images have been reconstructed and transferred to storage, the data processing server 714 may notify the data store server 716 on the operator workstation 702. The operator workstation 702 may be used by an operator to archive the images, produce films, or send the images via a network to other facilities.

The MRF system 700 may also include one or more networked workstations 742. For example, a networked workstation 742 may include a display 744, one or more input devices 746 (e.g., a keyboard, a mouse), and a processor 748. The networked workstation 742 may be located within the same facility as the operator workstation 702, or in a different facility, such as a different healthcare institution or clinic.

The networked workstation 742 may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may be exchanged between the data processing server 714 or the data store server 716 and the networked workstations 742, such that the data or images may be remotely processed by a networked workstation 742.

The present disclosure has described one or more preferred embodiments, and it should be appreciated that many equivalents, alternatives, variations, and modifications, aside from those expressly stated, are possible and within the scope of the invention.

We claim:

1. A method for generating a map of a tissue property in a subject using magnetic resonance fingerprinting (MRF) data, the method comprising:
   accessing MRF data formed by acquiring a series of signal evolutions from tissue of a subject in a region of interest while performing an MRF process using a nuclear magnetic resonance (NMR) or magnetic resonance imaging (MRI) system;
   accessing an MRF dictionary having entries that are a function of a tissue property vector given by q,d=d(q), wherein a given voxel is represented by $q_0$, an acquired MRF signal evolution from the given voxel is given by s=d($q_0$)+e, where s is the MRF signal evolution and e is a noise term;
   comparing the MRF data to the MRF dictionary to identify at least one tissue property of the region of interest by comparing inner product values between s and entries in the MRF dictionary; and
   generating the map of the at least one tissue property based on the tissue in the region of interest of the subject.

2. The method of claim 1, wherein identifying the tissue property is achieved upon finding a maximum in absolute value from the comparing of the inner product values between s and entries in the MRF dictionary.

3. The method of claim 1, wherein the inner product can be approximated as a quadratic function.

4. The method of claim 1, wherein the signal evolutions are described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0$$

where SE is a signal evolution; $N_S$ is a number of spins; $N_A$ is a number of sequence blocks in a pulse sequence of the MRF process; $N_{RF}$ is a number of RF pulses in a sequence block in the pulse sequence; $\alpha$ is a flip angle in the pulse sequence; $\phi$ is a phase angle; $R_i(\alpha)$ is a rotation due to off resonance; $R_{RF_{ij}}(\alpha,\phi)$ is a rotation due to RF differences; R(G) is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in a static magnetic field.

5. A magnetic resonance fingerprinting (MRF) system comprising:
   a magnet system configured to generate a polarizing magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
      control the magnetic gradient system and the RF system to perform an MRF process to acquire MRF data formed by acquiring a series of signal evolutions from tissue of a subject in a region of interest;
      access an MRF dictionary having entries that are a function of a tissue property vector given by q,d=d (q), wherein a given voxel is represented by $q_0$, an acquired MRF signal evolution from the given voxel is given by s=d($q_0$)+e, where s is the MRF signal evolution and e is a noise term;
      compare the MRF data to the MRF dictionary to identify a tissue property of the region of interest by comparing inner product values between s and each entry in the MRF dictionary; and
      generate the map of the tissue property based on the tissue in the region of interest of the subject.

6. The system of claim 5, wherein identifying the tissue property is achieved upon finding a maximum in absolute value from the comparing of the inner product values between s and entries in the MRF dictionary.

7. The system of claim 5, wherein the inner product can be approximated as a quadratic function.

8. The system of claim 5, wherein MRF process includes performing an MRF pulse sequence designed to elicit the series of signal evolutions.

9. The system of claim 8, wherein the MRF pulse sequence includes a fast imaging with steady-state free precession (FISP) or balanced steady-state free precession (bSSFP) pulse sequence.

10. The system of claim 8, wherein the signal evolutions are described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0$$

where SE is a signal evolution; $N_S$ is a number of spins; $N_A$ is a number of sequence blocks in the pulse sequence; $N_{RF}$ is a number of RF pulses in a sequence block in the pulse sequence; $\alpha$ is a flip angle in the pulse sequence; $\phi$ is a phase angle; $R_i(\alpha)$ is a rotation due to off resonance; $R_{RF_{ij}}(\alpha,\phi)$ is a rotation due to RF differences; R(G) is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in a static magnetic field.

\* \* \* \* \*